US008652305B2

(12) United States Patent
Levasseur et al.

(10) Patent No.: US 8,652,305 B2
(45) Date of Patent: Feb. 18, 2014

(54) METHOD FOR MANUFACTURING OF SPUTTERING TARGETS USING AN INORGANIC POLYMER

(75) Inventors: Alain Levasseur, Gradignan (FR); Brigitte Pecquenard, Talence (FR)

(73) Assignee: Centre National de la Recherche Scientifique, Paris (FR)

( * ) Notice: Subject to any disclaimer, the term of this patent is extended or adjusted under 35 U.S.C. 154(b) by 158 days.

(21) Appl. No.: 12/997,998

(22) PCT Filed: Jun. 17, 2009

(86) PCT No.: PCT/IB2009/006324
§ 371 (c)(1),
(2), (4) Date: Mar. 4, 2011

(87) PCT Pub. No.: WO2009/153664
PCT Pub. Date: Dec. 23, 2009

(65) Prior Publication Data
US 2011/0147207 A1 Jun. 23, 2011

(30) Foreign Application Priority Data
Jun. 18, 2008 (EP) .................................... 08290576

(51) Int. Cl.
*C23C 14/12* (2006.01)
(52) U.S. Cl.
USPC .................. 204/192.15; 204/298.12; 501/92; 65/32.5
(58) Field of Classification Search
None
See application file for complete search history.

(56) References Cited

U.S. PATENT DOCUMENTS

| 3,850,604 | A | * | 11/1974 | Klein | ............................. 65/32.5 |
| 5,208,192 | A | * | 5/1993 | Yu et al. | ........................... 501/92 |
| 5,569,520 | A | | 10/1996 | Bates | |
| 5,597,660 | A | | 1/1997 | Bates et al. | |
| 5,628,938 | A | * | 5/1997 | Sangeeta et al. | ................ 264/28 |
| 6,407,339 | B1 | | 6/2002 | Rice et al. | |
| 2006/0255716 | A1 | | 11/2006 | Tsutsumi et al. | |
| 2007/0114129 | A1 | * | 5/2007 | Hayashi et al. | .......... 204/298.12 |

FOREIGN PATENT DOCUMENTS

| JP | 6-204214 A | | 7/1994 |
| JP | 2003-115296 A | | 4/2003 |
| JP | 2003115296 A | * | 4/2003 |
| WO | WO-2005/085374 A1 | | 9/2005 |

OTHER PUBLICATIONS

A. Pradel, M. Ribes, Lithium chalcogenide conductive glasses, Materials Chemistry and Physics, vol. 23, Issues 1-2, Aug. 14, 1989, pp. 121-142, ISSN 0254-0584, 10.1016/0254-0584(89)90021-7. (http://www.sciencedirect.com/science/article/pii/0254058489900217).*
International Search Report from International Appl. No. PCT/IB2009/006324, mailed Oct. 22, 2009.
Written Opinion from International Appl. No. PCT/IB2009/006324, mailed Oct. 22, 2009.

* cited by examiner

*Primary Examiner* — Keith Hendricks
*Assistant Examiner* — Timon Wanga
(74) *Attorney, Agent, or Firm* — Alston & Bird LLP

(57) ABSTRACT

The invention relates to a cathodic sputtering target composition comprising at least a solid lithium-based electrolyte and an inorganic carbon free polymer, and to a method for the manufacturing of cathodic solid sputtering targets using such a composition. The invention also relates to solid sputtering targets obtained by such a method and to their use for the preparation of solid thin films by a sputtering physical vapor deposition process, in particular for the preparation of solid electrolyte thin films inside thin film batteries.

23 Claims, 1 Drawing Sheet

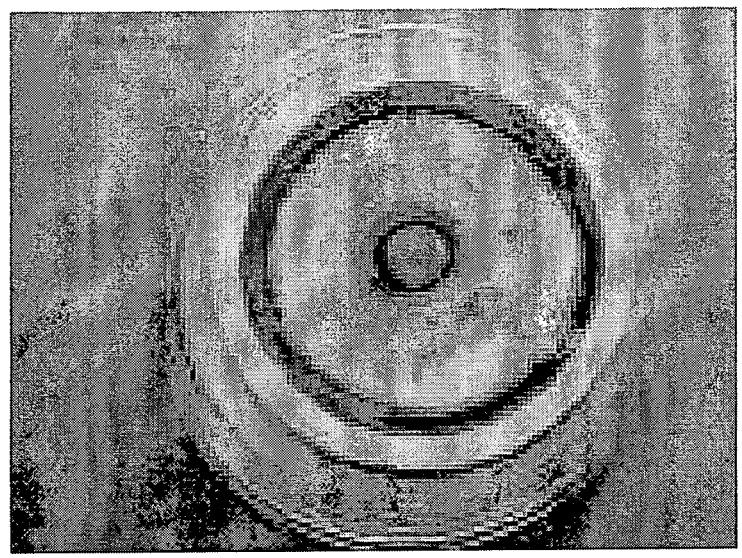

METHOD FOR MANUFACTURING OF SPUTTERING TARGETS USING AN INORGANIC POLYMER

FIELD OF THE INVENTION

The invention relates to a cathodic sputtering target composition comprising at least a solid lithium-based electrolyte and an inorganic carbon free polymer and to a method for the manufacturing of cathodic solid sputtering targets using such a composition. The invention also relates to solid sputtering targets obtained by such a method and to their use for the preparation of solid thin films by a sputtering physical vapour deposition process, in particular for the preparation of solid electrolyte thin films inside thin film batteries.

BACKGROUND OF THE INVENTION

Solid-state thin film batteries are typically formed by stacking thin films on a substrate in such a way that the films cooperate to generate a voltage. The thin films typically include current collectors, a positive cathode, a negative anode, a solid electrolyte (film) and different protective layers.

In a thin film battery configuration, the cathode layer is separated from the anode layer by an electronically insulating layer of solid electrolyte material. This electrolyte layer provides two functions. The first function is to conduct the electrochemically active ions between the cathode and the anode. The second function is to prevent the direct exchange of electrons between the cathode and the anode so that the electronic current becomes available only in the external circuit of the battery.

The solid electrolyte film and the electrode can be deposited onto the substrate by, for example, sputtering techniques such as radio frequency sputtering (RFS or RF sputtering) and RF magnetron sputtering (RFMS). These techniques are strictly physical vapor deposition (PVD) processes where charged ions of the plasma are bombarded on the surface of the target. Particles are ejected from the target and form a solid thin film layer on the substrate.

The present invention belongs to the field of solid electrolyte film deposition by PVD using cathodic sputtering targets.

Common solid electrolytes that are contained in solid-state thin film batteries must be free from any electronically conductive element, in particular they must be carbon-free, because they must prevent the direct exchange of electrons between the cathode and the anode to avoid any self discharge of the battery. They are often made from lithium in combination with one or several other elements such as phosphorus, silicium, sulphur, oxygen, boron, vanadium, etc. . . . . . As examples of lithium-based electrolytes used in the eighties, one can mention the following compositions: $Li_{3.6}Si_{0.6}P_{0.4}O_4$, 0.31 $Li_2SO_4$-0.31 $Li_2O$-0.38 $B_2O_3$, 0.82 $Li_2O$-0.08 $V_2O_5$-0.10 $SiO_2$, 0.55 LiI-0.36 $Li_3PO_4$-0.99 $P_2S_5$. The electrolytes now generally used in microbatteries since the beginning of the nineties are based on LiPON and are prepared by sputtering starting from a target of $Li_3PO_4$ in a nitrogen atmosphere. See, for instance, U.S. Pat. No. 5,569,520, Apr. 30, 1996 and U.S. Pat. No. 5,597,660, Jan. 28, 1997, issued to John B. Bates et al. The formula of LiPON is $Li_{3.3}PO_{3.9}N_{1.7}$ but can change slightly following the condition of its preparation with a slight change of its ionic conductivity.

Targets used during the sputtering processes used to make thin film solid electrolytes can be manufactured by admixing and reacting together the different components of the target, before melting them to obtain a glass. This glass is however not resistant enough to be used as such in a sputtering deposition process (the glass breaks or crazes) and has to be further grinded, pressed in a mold (for example in the form of a disc) and finally sintered in air, in inert gas (nitrogen, argon, . . . ) or under vacuum at temperatures that generally range from 400 to 600° C. but which can also reach 900° C. or more before being usable in a sputtering process.

This target manufacturing process is then long and difficult to put into practice at an industrial scale. In addition, the high temperatures needed by this process lead to the evaporation or to the sublimation of some of the most volatile compounds present in the mixtures that will change the final composition of the starting material and thus the final composition of the thin film solid electrolyte that will be finally deposited onto the substrate.

Another process sometimes usable to prepare sputtering targets consists in molding the mixtures of the different pulverulent components in a mold under pressure. However, the targets thus obtained even dense are brittle and need to be further sintered to enhance their mechanical resistance. This sintering step has often to be repeated twice to obtain targets having satisfactory mechanical resistance properties.

The use of processes involving such high temperatures is a limiting factor because it forbids the presence of volatile at low temperature compounds and/or of sensitive to high temperature compounds in the solid electrolyte starting composition.

SUMMARY OF THE INVENTION

The inventors have developed the subject of the invention in order to solve these problems. They have in particular set themselves the aim of providing a solid electrolyte composition the use of which is compatible with the presence of volatile at low temperature compounds and/or of sensitive to high temperature compounds in the final composition of the targets and with while leading to carbon-free cathodic sputtering targets (and more generally sputtering targets without any electronic conducting material) that have a satisfying resistance to the sputtering process and that can be manufactured more quickly and more easily by a process not necessitating too high temperatures.

At this occasion, the inventors have found that the use of a cathodic sputtering target starting composition comprising at least one solid lithium-based electrolyte and at least one particular carbon-free inorganic polymer, during a sputtering target manufacturing process, resolves this technical problem and leads quickly and easily to sputtering targets in which the presence of volatile at low temperature compounds and/or sensitive to high temperature compounds is possible because the compulsory use of very high temperatures during the manufacturing process is thus avoided.

A first subject of the present invention is therefore a cathodic sputtering target starting composition comprising:
at least one pulverulent ion-conductive solid lithium-based electrolyte, said electrolyte being electronically insulating, and
at least one carbon-free inorganic polymeric binder selected from the group consisting of perhydropolysilazanes, in an amount of at least 5% in weight relative to the total weight of said composition.

Perhydropolysilazanes (PHPS) are known compounds sold under the tradename Polysilazane® NN 120-20 by the firm Kyon which is a branch of Clariant Chemical Company. Usually this type of inorganic polymers is used as a coating for surfaces, especially for metal and polymer surfaces, as it is described for example in international application WO 2005/085374. Their use leads to thick protective coats which, for example, protect wheel rims against corrosion, scratching and eating-in of brake dust and also make easier to clean the rims. In some case, this kind of inorganic polymers can also comprise a catalyst.

However, their use as component in solid electrolyte starting sputtering compositions for the preparation of sputtering targets useful for the sputtering deposition of solid thin film electrolytes in batteries had never been envisaged.

The inventors have found that the use of PHPS, as a binder in solid lithium-based electrolyte starting sputtering compositions, makes it possible to prepare dense targets and avoids the sintering of targets at high temperature. This helps to use temperature sensitive materials such as for example nitrogen-based electrolyte additives like lithium nitride ($Li_3N$) and/or nitrogen-based additives like aluminium nitride (AlN) or silicium nitride ($Si_3N_4$), in the starting sputtering target composition. The materials contained in the target generally evaporate or are oxidized if the target is sintered at high temperature. Additionally, the inventors have found that the use of PHPS in combination with a lithium-based electrolyte is also of interest in the sense that it allows the incorporating, in the target, of a sufficient amount of nitrogen to prepare nitrogen rich thin film solid electrolytes. The incorporation of nitrogen into the film structure improves the ionic conductivity of thin film solid electrolytes which are the most promising materials for thin film micro battery devices.

Therefore, by using a cathodic sputtering target starting composition comprising PHPS, it is now possible to prepare quickly and easily, at low temperatures, dense and solid sputtering targets having a very good ionic conductivity.

According to a preferred embodiment of the invention, the PHPS are chosen among compounds of formula (I) below:

(I)

in which n is an integer value such that the perhydropolysilazane has a number-average molecular weight ranging 150 to 150 000 g/mol.

BRIEF DESCRIPTION OF THE DRAWINGS

FIG. 1 represents the photography of a solid sputtering target made from a sputtering composition containing a solid electrolyte, PHPS and glass fibers, after its use in a sputtering physical vapor deposition process.

DETAILED DESCRIPTION OF THE INVENTION

The amount of PHPS is preferably ranging from 5 to about 30% in weight, more preferably from about 15 to 25% in weight, relative to the total weight of the sputtering composition. These percentages will of course depend on the material used for the electrolyte.

In the sputtering target composition according to the invention, PHPS are preferably used in solution in a solvent. Solvents suitable for the PHPS are, in particular, organic solvents which contain no water and also no reactive groups (such as hydroxyl groups or amine groups) and that will totally evaporate during the sputtering process. These solvents are, for example, chosen among aliphatic or aromatic hydrocarbons, halogenated hydrocarbons, esters such as ethyl acetate or butyl acetate, ketones such as acetone or methyl ethyl ketone, ethers such as tetrahydrofuran or di-n-butylether, and also mono- and polyalkyl glycol dialkylethers (glymes), and mixtures thereof.

Among these solvents, the use of ethers such as di-n-butylether is particularly preferred.

When the PHPS is in solution in a solvent, the resulting PHPS solution preferably contains from 15-25% in weight of PHPS for 75-85% in weight of solvent.

The pulverulent ion-conductive solid lithium-based electrolytes are preferably chosen among lithium borates ($LiBO_2$, $Li_2B_4O_7$, ...); lithium silicates ($Li_4SiO_4$, ...); lithium germanates ($Li_2GeO_3$, ...); lithium phosphates ($Li_3PO_4$); lithium salts such as lithium sulfates ($Li_2SO_4$, ...), lithium iodides, lithium chlorides and lithium fluorides; lithium nitride ($Li_3N$); and mixtures thereof.

According to a preferred embodiment of the invention, the pulverulent ion-conductive solid lithium-based electrolytes is a mixture comprising at least a lithium borate, a lithium sulfate, a lithium phosphate and a lithium nitride.

According to another preferred embodiment of the invention, the pulverulent ion-conductive solid lithium-based electrolytes represent from 70 to 96% in weight, more particularly from 77 to 90% in weight, relative to the total weight of the sputtering composition.

According to another embodiment, the cathodic sputtering target starting composition of the invention may also comprise other pulverulent ion-conductive solid electrolytes, preferably chosen among lithium-, aluminium- and silicium-based electrolytes.

Nitrogen-based additives may also be added to the cathodic sputtering target starting composition of the invention, the incorporation of nitrogen leading to thin film having improved ionic conductivity. Preferably, the nitrogen-based additives are chosen among aluminium nitride (AlN) and silicium nitride ($Si_3N_4$).

Deposition of solid electrolyte films having a thickness of about 1 μm generally involves a sputtering process lasting from about 2 to 10 hours or even more. Sputtering targets are sometimes not resistant enough to support high sputtering power and/or a long sputtering duration and may break or craze before the end of the sputtering process.

Therefore, according to a preferred embodiment of the invention, the sputtering target composition further comprises at least one mechanical reinforcement, said mechanical reinforcement being free from any electronically conducting material.

The presence of such a mechanical reinforcement in the sputtering target composition is not compulsory but enhances the resistance of the targets during the sputtering process thus authorizing a high sputtering power and/or a long sputtering duration.

Preferably, the mechanical reinforcement represents from about 0.5 to about 0.8% in weight relative to the total weight of the composition (depending on the density of such a reinforcement).

According to the invention the nature of the mechanical reinforcement is not critical as soon as it is free from any electronically conducting material, in particular free from carbon, to not increase the electronic conductivity of the resulting solid electrolyte films.

The mechanical reinforcement can be chosen among fibers, particles, flakes and/or fillers. As specific examples: fibers, particles, flakes, and/or fillers made of glass (E-glass, S-glass, D-glass), aluminum oxide, aluminum silica, asbestos, quartz (fused silica), or any other electronically insulating fillers and mixtures thereof, can be mentioned.

The mechanical reinforcement is preferably in the form of fibers.

The length of the fibers has to be adjusted to the size of the target and may be easily determined by the man skilled in the art.

For targets having a diameter ranging from 4 to 10 cm, the mechanical reinforcement is preferably chosen among fibers having a length of about 0.1 to 5 cm inclusive, more preferably of about 0.2 to 0.3 cm inclusive. In this case, the diameter of the fibers generally ranges from 0.1 to 0.5 μm and more preferably from 0.1 to 0.3 μm.

The inventors have found in this particular case that a higher length or a higher diameter of fibers causes the formation of a separate layer (cleavage) in the sputtering target after pressing the starting material. However, for larger targets having a size up to few meters, it is possible to use longer fibers, for examples fibers having a length of few meters. The length and the diameter of the fibers will be of course easily adapted to the final size of the target by the man skilled in the art.

According to a particularly preferred embodiment of the present invention, and when the composition is designed for the preparation of a final target having a size ranging between 5 and 8 cm inclusive, the mechanical reinforcement consists of glass fibers of about 0.3 cm in length maximum and of an average diameter of about 0.1 μm.

The cathodic sputtering target pulverulent composition that has been described above is generally in the form of a paste that can be prepared by the simple mixture of the different components contained therein according to classical methods well known by the one skilled in the art.

Another object of the present invention is a process for the manufacturing of carbon-free solid cathodic sputtering targets comprising at least the following steps:

- a formatting step of a cathodic sputtering target composition as described above into a shape corresponding to the shape of the desired final target,
- a heating step of the resulting formatted composition at a temperature ranging from about 150° C. to about 300° C. for about 3 to about 10 min, and
- a reticulation step of the perhydropolysilazane comprised in the cathodic sputtering target composition of the invention.

According to a first embodiment of that process, the formatting step is carried out by molding said cathodic sputtering target composition under a molding pressure ranging from 20 to 100 MPa, more preferably from 50 to 80 MPa, following the composition of the target. By this molding step, it is for example possible to obtain solid targets having the shape of a disc, or of any other form such as a square, a rectangle, a cylinder, etc. . . . For example, and for a lab scale target having the form of a disc, the diameter is typically 5 cm, and the thickness is around 3 to 5 mm. The thickness of the target may of course depend on the size of the target.

According to a second embodiment of that process, the formatting step can also be carried out by applying a layer of said cathodic sputtering target composition on or around a solid support, for example around a cylindrical solid support.

The heating step leads to the polymerization of the components contained in the cathodic sputtering target composition, the binder forming cross-linked chains with the solid electrolytes, firstly of the —Si—N—Si— type and secondly of the —Si—O—Si— type that confer to the resulting shaped solid resulting target a satisfying mechanical resistance.

Preferably, the heating step is carried out at a temperature of between about 160 and 220° C. inclusive, more preferably between about 180 and 200° C. inclusive, for about 3 to 5 min. These particular conditions may of course vary slightly depending on the dimensions (for example diameter and thickness) and on the composition of the targets.

The solid cathodic sputtering targets that are obtained according to that process constitute another subject matter of the present invention.

Therefore, the invention also relates to cathodic sputtering solid target obtained according to the above-described process, wherein said targets are free from any electronically conductive material and comprise at least one polymerized solid material comprising:

- at least one pulverulent ion-conductive lithium-based solid electrolyte, said electrolyte being electronically insulating, and
- at least one reticulated carbon-free inorganic polymeric binder selected from the group consisting of perhydropolysilazanes, in an amount of at least 5% in weight relative to the total weight of said composition.

Preferably, the polymerized solid material present in the catodic sputtering solid target of the invention results from the polymerization, at a temperature ranging from about 150° C. to about 300° C. for about 3 to about 10 min, of a cathodic sputtering target starting composition as previously described, i.e. comprising:

- at least one pulverulent ion-conductive lithium-based solid electrolyte, said electrolyte being electronically insulating, and
- at least one carbon-free inorganic polymeric binder selected from the group consisting of perhydropolysilazanes, in an amount of at least 5% in weight relative to the total weight of said composition.

According to a preferred embodiment of the invention, these solid targets have the shape of a disc, a square, a rectangle, a cylinder or any shape with a thickness depending on the size of the target, but in the range of a few mm to a few cm.

These targets have generally a density ranging from about 1 g/cm$^3$ to about 3 g/cm$^3$.

Finally, the invention also relates to the use of the above-mentioned cathodic sputtering solid targets for the sputtering physical vapor deposition of solid thin films onto the surface of a solid substrate, in particular for the deposition of solid thin electrolyte films inside thin film batteries.

The solid thin films obtained from the solid cathodic sputtering target of the invention comprise:

- at least one pulverulent ion-conductive lithium-based solid electrolyte, said electrolyte being electronically insulating, and
- at least one reticulated carbon-free inorganic polymeric binder selected from the group consisting of perhydropolysilazane, in an amount of at least 5% in weight relative to the total weight of said composition.

These targets can also be used for any other solid thin film deposition needing targets with low melting point or low evaporation temperature compounds for example in electrochromic devices.

As the polymerization occurs around 200° C., the invention allows the use, during the manufacturing of the target, of materials with low melting point or low evaporation temperature.

Besides the arrangements above, the invention also comprises other arrangements which will emerge from the following description, which refers to examples of preparation of sputtering targets according to the invention and to a comparative example showing the resistance of two sputtering targets as prepared according to the method of the invention, and from the attached drawing in which FIG. 1 represents the photography of a solid sputtering target made from a sputtering composition containing a solid electrolyte, PHPS and glass fibers, after its use in a sputtering physical vapor deposition process.

It should be clearly understood, however, that these examples are given only by way of illustration of the subject of the invention, of which they in no way constitute a limitation.

EXAMPLES

Example 1

Preparation of a Solid Lithium-Based Sputtering Target According to the Process of the Invention A mixture of lithium metaborate ($LiBO_2$) in 42 mol %, lithium sulphate ($Li_2SO_4$) in 28 mol % and lithium nitride ($Li_3N$) in 30 mol % was the desired chemical composition to prepare the starting sputtering target composition.

A 13 gram batch composition has been chosen to prepare a sputtering target suitable for the comfortable fitness in the cathode. The $LiBO_2$ powder of 42 mol % equal to 4.372 gram, $Li_2SO_4$ powder of 28 mol % equal to 6.442 gram and $Li_3N$ powder of 30 mol % equal to 2.187 gram are the weights taken for the starting materials.

Since lithium metaborate and lithium nitride are hygroscopic compounds which easily react with the moisture, all the powders were kept inside a glow box which was maintained at an inert dry argon gas atmosphere before their use. An X-ray analysis of the starting material was performed before starting the manufacturing of the target to check the formation of the phases present in the starting materials. The X-ray diffraction patterns of the starting materials were found conformed to the database.

The lithium based powder mixture was then mixed and grinded well in a mortar until the obtaining of a uniform mixture.

Glass fibers (sold under the reference "glass fiber tissue" by the firm SINTOFER) were cut into small pieces of 0.3 cm in length. The small pieces of 0.3 cm glass fibers of 0.7 in weight percent to the starting materials has been desired to use it in the sputtering target. These glass fibers were added in an amount of 0.7 in weight percent to the lithium powder mixture which corresponds to an amount of 0.091 g of glass fibers. The small pieces of glass fibers were then mixed with the lithium based powder mixture until obtaining an intimate mixture.

3.25 g of a 20% (w/w) solution of PHPS in di-n-butylether were then slowly added to the mixture of starting materials under mixing with a stainless steel spatula until obtaining a homogeneous mixture of starting materials.

PHPS represented 25% in weight relative to the total weight of the starting material sputtering target composition.

The mixture of starting material was then pressed using a stainless steel die. A sputtering target of 5 cm diameter suitable to fit in the cathode of thin film deposition chamber was prepared using this die. To do so, the mixture of starting materials was placed in the stainless steel die and the sputtering target was prepared by pressing 75 MPa. Applying more than 100 MPa would lead to spread the solvent out of the die and the powdered mixture.

The resulting pressed mixture was then sintered at 180° C. for 3 to 5 minutes which is the minimum duration required to evaporate the solvent. The sintered sputtering target had a thickness (t) of 0.51 cm, a diameter (d) of 5.0 cm and a weight (w) of 12.784 g. The actual density of that sputtering target was found to be 1.58 g/cm$^3$.

The theoretical density of the starting mixtures was calculated and it was found to be 2.14 g/cm$^3$.

The apparent density of the sputtering target was calculated by the ratios of actual density of sputtering target to the theoretical density. The percentage of apparent density was found to be 74.0%.

The solid sputtering target prepared by this method was hard enough and suitable to be used in a sputtering physical vapor deposition process for the deposition of a thin solid electrolytes film onto the surface of a solid substrate.

Example 2

Use of Solid Sputtering Targets According to the Invention for the Deposition of a Solid Thin Electrolyte Film onto a Substrate The sputtering target here-above prepared in example 1 was then used for the deposition of a solid thin electrolyte film onto the surface of a solid substrate.

Sputtering parameters used for the deposition were the following:

Base pressure of sputtering chamber=$1\times10^{-6}$ mbar,
Working pressure=$6\times10^{-3}$ mbar,
Power applied to the sputtering target=35 watts.

A thin tin disc was used in between the sputtering target and the cathode to have good thermal contact during thin film deposition. The target has sputtered up to 15 hours. Even after the 15 hours of sputtering the condition of the target was good, there was no crack on the sputtering target. The target was first sputtered under argon plasma and then under a nitrogen reactive plasma. The sputtered target at the end of the sputtering process is shown on annexed FIG. 1.

The sputtering target prepared in this process is durable for the deposition of thin film solid electrolytes by a sputtering deposition process.

An alternative sputtering target, also forming part of the present invention, made from the same starting material than the solid sputtering target as prepared in example 1, except glass fibers, was also prepared according to the method described in example 1.

This sputtering target was then used for the deposition of a solid thin electrolyte film onto the surface of a solid substrate.

The same sputtering parameters and conditions than those used for the deposition of the film with the sputtering target as prepared according to example 1 were also used with this alternative sputtering target not containing any mechanical reinforcement.

The deposition process was also carried out for 15 hours.

This target resisted at least 11 hours to the conditions applied during the deposition process before breaking at the end of the process which is totally acceptable and very satisfying for a target which has been prepared according to a manufacturing method using only mild conditions.

The invention claimed is:

1. A process for the manufacturing of carbon-free solid cathodic sputtering targets, wherein said process comprises at least the following steps:
    a formatting step of a cathodic sputtering target composition into a shape corresponding to the shape of the desired final target, said composition comprising:
    at least one pulverulent ion-conductive solid lithium-based electrolyte, said electrolyte being electronically insulating, and at least one carbon-free inorganic polymeric binder selected from the group consisting of perhydropolysilazanes, in an amount of at least 5% in weight relative to the total weight of said composition, said composition being free of any electronic conducting material, a heating step of the resulting formatted composition at a temperature ranging from 150° C. to 300° C. for 3 to 10 min, and a reticulation step of the perhydropolysilazane comprised in the cathodic sputtering target composition of the invention.

2. The process of claim 1, wherein the formatting step is carried out by molding said cathodic sputtering target composition under a molding pressure ranging from 20 to 100 MPa.

3. The process of claim 2, wherein the molding pressure ranges from 50 to 80 MPa.

4. The process of claim 1, wherein the formatting step is carried out by applying a layer of said cathodic sputtering target composition on or around a solid support.

5. The process of claim 1, wherein the heating step is carried out at a temperature of between about 160 and 220° C. inclusive for about 3 to 5 min.

6. The process of claim 1, wherein the perhydropolysilazanes are chosen among compounds of formula (I) below:

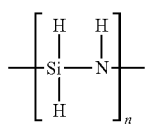

in which n is an integer value such that the perhydropolysilazane has a number-average molecular weight ranging 150 to 150 000 g/mol.

7. The process of claim 1, wherein the amount of perhydropolysilazane ranges from 5 to 30% in weight relative to the total weight of said composition.

8. The process of claim 1, wherein the amount of perhydropolysilazane ranges from 15 to 25% in weight relative to the total weight of said composition.

9. The process of claim 1, wherein perhydropolysilazanes are in solution in a solvent.

10. The process of claim 1, wherein said solvent is chosen among aliphatic or aromatic hydrocarbons, halogenated hydrocarbons, esters, ketones, ethers, mono- and polyalkyl glycol dialkylethers and mixtures thereof.

11. The process of claim 1, wherein said solvent is di-n-butylether.

12. The process of claim 1, wherein said composition further comprises other pulverulent ion-conductive solid electrolytes, preferably chosen among lithium-, aluminium- and silicium-based electrolytes.

13. The process of claim 1, wherein ion-conductive solid electrolytes are chosen among lithium borates; lithium silicates; lithium germanates; lithium phosphates; lithium salts; and mixtures thereof.

14. The process of claim 1, wherein the pulverulent ion conductive solid electrolytes is a mixture comprising at least a lithium borate, a lithium sulfate, a lithium phosphate and a lithium nitride.

15. The process of claim 1, wherein the pulverulent ion-conductive solid lithium-based electrolytes represent from 70 to 96% in weight, relative to the total weight of said composition.

16. The process of claim 1, wherein the pulverulent ion-conductive solid lithium-based electrolytes represent from 77 to 90% in weight, relative to the total weight of said composition.

17. The process of claim 1, wherein said composition further comprises a nitrogen-based additive chosen among aluminium nitride (MN) or silicium nitride ($Si_3N_4$).

18. The process of claim 1, wherein said composition further comprises at least one mechanical reinforcement, said reinforcement being free from any electronically conducting material.

19. The process of claim 1, wherein the mechanical reinforcement represents from 0.5 to 0.8% in weight, relative to the total weight of said composition.

20. The process of claim 1, wherein the mechanical reinforcement is chosen among fibers, particles, flakes, and/or fillers made of glass, aluminum oxide, aluminum silica, asbestos, quartz or any other electronically insulating fillers and mixtures thereof.

21. The process of claim 1, wherein the mechanical reinforcement is in the form of fibers.

22. The process of claim 1, wherein the mechanical reinforcement is chosen among fibers having a length of about 0.1 to 5 cm inclusive.

23. The process of claim 1, wherein the mechanical reinforcement consists of glass fibers of about 0.3 cm in length maximum and of an average diameter of about 0.1 um.

* * * * *

UNITED STATES PATENT AND TRADEMARK OFFICE
CERTIFICATE OF CORRECTION

| | | |
|---|---|---|
| PATENT NO. | : 8,652,305 B2 | Page 1 of 1 |
| APPLICATION NO. | : 12/997998 | |
| DATED | : February 18, 2014 | |
| INVENTOR(S) | : Levasseur et al. | |

It is certified that error appears in the above-identified patent and that said Letters Patent is hereby corrected as shown below:

In the claims:

Column 10,
Line 11, "lithium germanates" should read --lithium gerrnanates--.

Signed and Sealed this
Twenty-seventh Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,652,305 B2  
APPLICATION NO. : 12/997998  
DATED : February 18, 2014  
INVENTOR(S) : Alain Levasseur et al.

Page 1 of 1

It is certified that error appears in the above-identified patent and that said Letters Patent is hereby corrected as shown below:

This certificate supersedes the Certificate of Correction issued May 27, 2014. The certificate is vacated since request was filed in error by patentee. The patent is reinstated to its originally-issued form.

In the Specification

Column 23, line 43, "lithium gerrnanates" should read --lithium germanates--.

Signed and Sealed this  
Twenty-fourth Day of June, 2014

Michelle K. Lee  
*Deputy Director of the United States Patent and Trademark Office*